United States Patent [19]
Coots et al.

[11] Patent Number: 5,694,073
[45] Date of Patent: Dec. 2, 1997

[54] TEMPERATURE AND SUPPLY-VOLTAGE SENSING CIRCUIT

[75] Inventors: Timothy J. Coots, The Woodlands; Phat C. Truong; Sung-Wei Lin, both of Houston; Tim M. Coffman, Sugar Land; Ming-Bo Liu, Houston; Ronald J. Syzdek, Sugar Land, all of Tex.

[73] Assignee: Texas Instruments Incorporated, Dallas, Tex.

[21] Appl. No.: 560,768

[22] Filed: Nov. 21, 1995

[51] Int. Cl.[6] .................... G05F 3/02; H03K 17/14
[52] U.S. Cl. .................... 327/362; 327/513; 327/541; 327/542
[58] Field of Search .................... 323/907; 327/512, 327/513, 538, 539, 540, 541, 543, 545, 362, 378, 542

[56] References Cited

U.S. PATENT DOCUMENTS

| | | | |
|---|---|---|---|
| 4,158,804 | 6/1979 | Butler et al. | 327/427 |
| 4,970,497 | 11/1990 | Broadwater et al. | 327/512 |
| 4,975,598 | 12/1990 | Borkar | 326/32 |
| 4,978,905 | 12/1990 | Hoff et al. | 327/427 |
| 5,021,684 | 6/1991 | Ahuja et al. | 327/541 |
| 5,045,773 | 9/1991 | Westwick et al. | 327/542 |
| 5,066,873 | 11/1991 | Chan et al. | 327/541 |
| 5,095,227 | 3/1992 | Jeong | 327/512 |
| 5,146,152 | 9/1992 | Jin et al. | 323/907 |
| 5,157,285 | 10/1992 | Allen | 327/545 |
| 5,336,942 | 8/1994 | Khayat | 327/513 |
| 5,373,226 | 12/1994 | Kimura | 327/513 |

Primary Examiner—Timothy P. Callahan
Assistant Examiner—Terry L. Englund
Attorney, Agent, or Firm—Theodore D. Lindgren; Robby T. Holland; Richard L. Donaldson

[57] ABSTRACT

A supply-voltage detecting stage (11) that supplies first and second reference currents ($I_{REFP}$ and $I_{REFN}$) which vary with the supply voltage ($V_{cc}$) and are coupled by first and second gain stages (12A and 12B), respectively, to first and second temperature-detecting stages (13A and 13B), respectively. First and second temperature-detecting stages (13A and 13B) increase the coupled reference currents ($I_{REFP}$ and $I_{REFN}$), respectively, to compensate for temperature increase through use temperature-sensitive, long-channel transistors (M34–M37 and M42–M45), supplying temperature and supply-voltage compensated output bias voltages at output terminals (MIRN and MIRP).

21 Claims, 4 Drawing Sheets

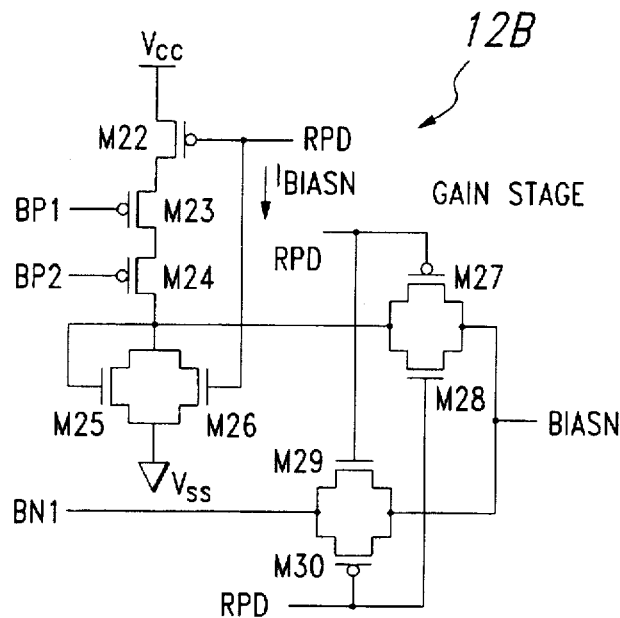
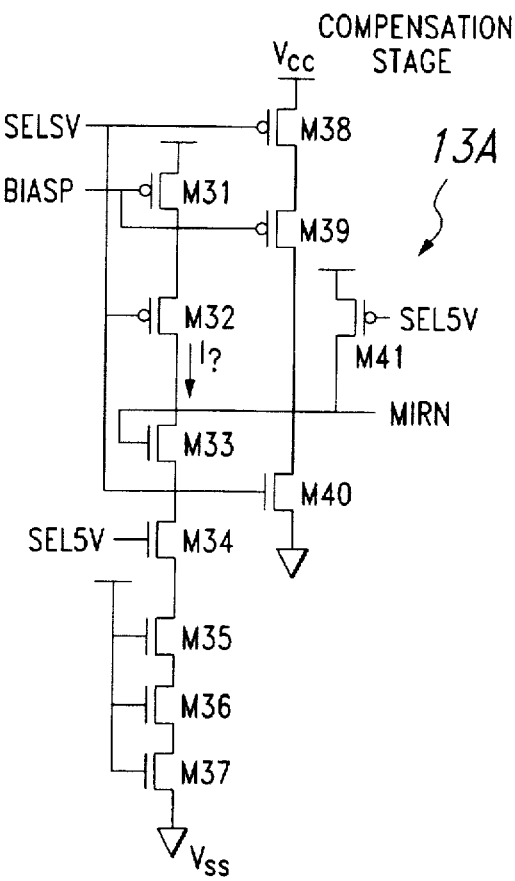
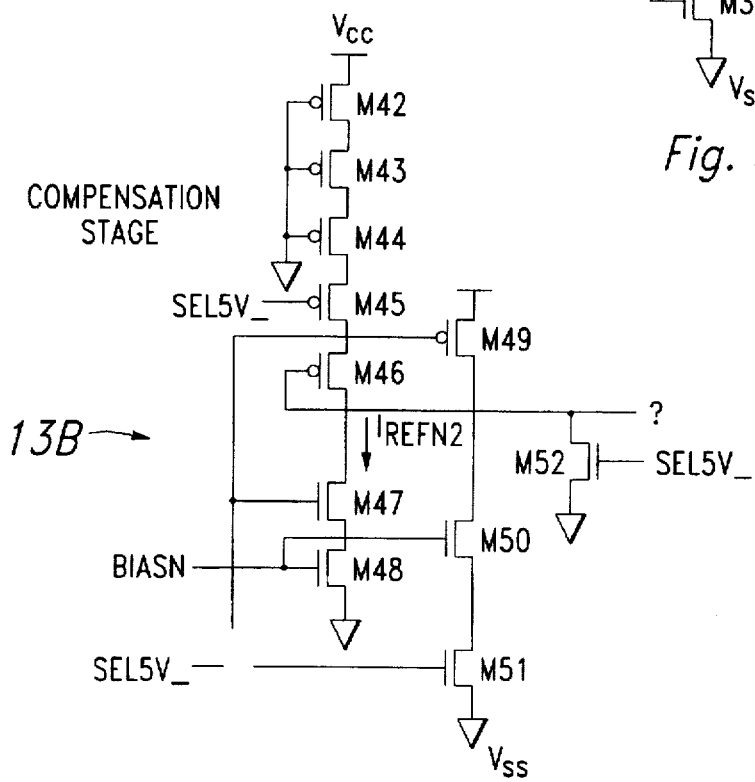
Fig. 2b
Fig. 3A
Fig. 3B

TEMPERATURE AND SUPPLY-VOLTAGE SENSING CIRCUIT

RELATED APPLICATION

This application is related to abandoned U.S. patent application Ser. No. 08/531,266 filed Sep. 20, 1995 entitled "TEMPERATURE AND SUPPLY VOLTAGE COMPENSATING OUTPUT BUFFER", also assigned to Texas Instruments Incorporated.

BACKGROUND OF THE INVENTION

This invention relates to integrated-circuits requiring current or gain compensation for supply-voltage and temperature variations. Specifically, this invention relates sensing supply-voltage and temperature variations to provide a signal for improving integrated-circuit speed, noise immunity, and power requirement.

Under certain circumstances, the operating speed of CMOS circuits is limited by the worst-case speed conditions, which are a low supply voltage and a high temperature. However, when CMOS circuitry is exposed to conditions of high supply voltage and low temperature, the speed increases from the speed set using worst-case speed conditions of low supply voltage and high temperature.

Under other circumstances, the operating speed of CMOS circuitry is limited by the worst-case noise conditions, which are a high supply voltage and a low temperature. The latter conditions tend to produce excessive transient noise, especially when multiple circuits on the chip switch simultaneously. Operation of multiple circuits at higher data-transfer speed tends to increase the transient noise problem. This is also a source of power loss.

In the prior-art, it is often necessary to set the speed to an even lower rate than that allowable under worst-case speed conditions in order to decrease transient noise to acceptable levels.

In addition to related abandoned U.S. patent application Ser. No. 08/531,266 filed Sep. 20, 1995, examples of compensation circuits are described in U.S. Pat. No. 4,975,598 issued Dec. 4, 1990, entitled TEMPERATURE, VOLTAGE, AND PROCESS COMPENSATED OUTPUT DRIVER; U.S. Pat. No. 4,978,903 issued Dec. 18, 1990, entitled NOISE REDUCTION OUTPUT BUFFER; and U.S. Pat. No. 5,021,684 issued Jun. 4, 1991 entitled PROCESS, SUPPLY, TEMPERATURE COMPENSATING CMOS OUTPUT BUFFER.

There is need for a circuit that provides an output signal indicative of the state of the supply voltage and the temperature. The output signal can then be used to overcome the problems described above, allowing operation at maximum speed during worst-case speed conditions while suppressing noise during worst-case noise conditions.

SUMMARY OF THE INVENTION

The circuit of this invention provides an indication of the state of the supply voltage and the temperature by utilizing a supply-voltage-detecting stage and a temperature-detecting stage to provide output signals that may be used to compensate for temperature and supply variation to overcome the speed, noise, and/or power limitations associated with CMOS circuitry. The temperature-detecting stages include long-channel transistors with temperature-sensitive resistances.

More specifically, the circuit of this invention includes a supply-voltage-detecting stage that supplies first and second reference currents. The first and second reference currents vary with the supply voltage and are coupled by first and second gain stages, respectively, to first and second temperature-detecting stages, respectively. The first and second temperature-detection stages increase the coupled reference currents, respectively, to compensate for temperature increase through use temperature-sensitive, long-channel transistors, supplying temperature and supply-voltage compensated output bias voltages, respectively.

BRIEF DESCRIPTION OF THE DRAWINGS

In the drawings:

FIGS. 2A and 2B are schematic diagrams of current-gain stages for use with this invention;

FIGS. 3A and 3B are schematic diagrams of the temperature-detecting circuits of this invention;

DETAILED DESCRIPTION OF THE INVENTION

Figure 1:
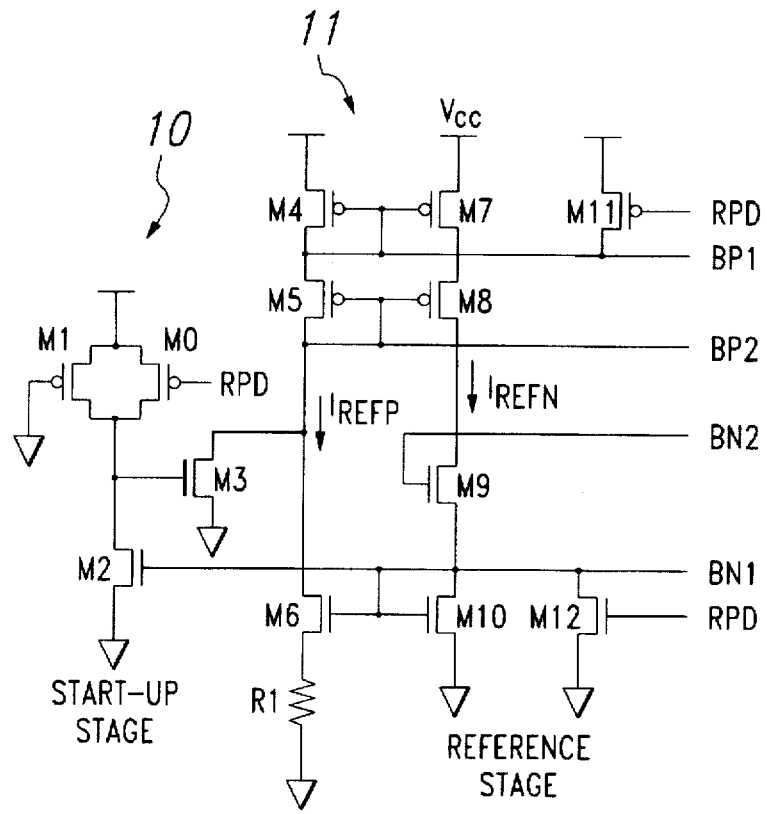
FIG. 1 is a schematic diagram of the supply-voltage detecting stage of this invention.

FIG. 1 illustrates a start-up stage 10 and a supply-voltage-detecting stage 11. To provide proper operation after the supply-voltage $V_{CC}$ ramp during power-up, transistors M1–M3 of start-up stage 10 initialize the supply-voltage-detecting stage 11. After initialization, an initial reference current $I_{REFN}$ establishes and, by feedback, turns off the start-up circuit 10. The supply-voltage-detecting stage 11 includes transistors M4–M10 and resistor R1. Transistors M0, M11, and M12 are used to control power-up/power-down states. Transistors M4–M10 and R1 are sized to accommodate desired initial reference currents $I_{REFP}$ and $I_{REFN}$ while at the same time realizing a manageable layout. The supply-voltage-detecting stage 11 is arranged in a cascode configuration to minimize the drain effects on transistors M4 and M7 and decrease variability with supply-voltage $V_{CC}$. Typically, the initial reference currents $I_{REFP}$ and $I_{REFN}$ increase with increasing supply voltage $V_{CC}$ and decreasing temperature. However, variation due to temperature is relatively small. Signals BN1 and BN2 are approximately one N-channel threshold voltage Vt and two N-channel voltage thresholds Vt up from ground voltage $V_{SS}$, respectively. Signals BP1 and BP2 are approximately one P-channel threshold voltage Vt and two P-channel threshold voltages Vt down from supply voltage $V_{CC}$, respectively.

In FIG. 1, signal RPD is used to disable the start-up and supply-voltage-detecting stages 10 and 11 to cut the DC bias current to almost zero during power-down. When signal RPD is high, the start-up and supply-voltage-detecting stages 10 and 11 are disabled.

Figure 2A:
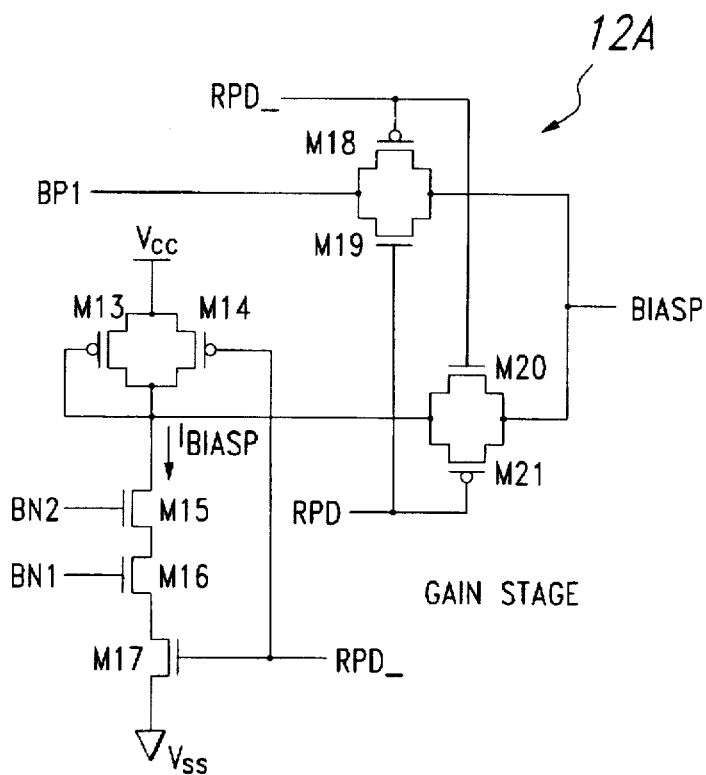

The $I_{REFP}$ and $I_{REFN}$ currents generated by supply-voltage-detecting stage 11 are mirrored to a pair of gain stages 12A and 12B, as illustrated in FIGS. 2A and 2B, respectively. Transistors M13–M17 of FIG. 2A comprise the gain stage 12A for current $I_{REFN}$. Likewise, transistors M22–M26 of FIG. 2B comprise the gain stage 12B for current $I_{REFP}$. Bias levels at inputs BN1 and BN2 of FIG. 2A, coupled to respective outputs of supply-voltage-detecting circuit 11 of FIG. 1, and transistor sizing for transistors M15 and M16 impose a current $I_{BIASP}$ through transistors M13, M15–M17, which is mirrored from transistors M9 and M10, respectively, thus establishing the final output bias level at terminal BIASP of gain stage 12A. For example, for a gain of fifteen, the channel widths of transistors M15 and M16 are each fifteen times the channel-widths of transistors M9 and M10 (transistors M15 and M16 have channel length-to-width ratios of 150-to-2 and transistors M9 and M10 have channel-length-to-width ratios of 10-to-2). Likewise, bias levels for BP2 and BP1 of FIG. 2B, coupled to respective outputs of supply-voltage-detecting circuit 11 of FIG. 1, and transistor sizing for transistors M23 and M24 impose a current $I_{BIASN}$ through transistors M22–M25 thus establishing the final output bias level at terminal BIASN of gain stage 12B. Relative channel-width sizing of transistors M15,M16 to M9,M10 and of transistors M23,M24 to M7,M8 determines the gain of stages 12A and 12B and allows for proper amplification of current prior to the temperature-detecting stages 13A and 13B of FIGS. 3A and 3B. Proper amplification is a function of many factors, including the range of desired output voltage change for the range of change in supply voltage $V_{CC}$. An amplification factor of fifteen was found to be optimum for the application illustrated in this embodiment. Transistors M18–M21 of FIG. 2A and M27–M30 of FIG. 2B are used to select the proper bias level upon power-up for the purpose of improving power-up recovery time. During power-up, output signals at terminals BIASP and BIASN, from the gain stages, are initially set at the BP1 and BN1 signal levels, respectively. The signals at terminals BIASP and BIASN are switched to final output levels after stabilization at those final output levels.

In FIGS. 2A and 2B, signals RPD and its inverse RPD__ are used to control gain-stages 12A and 12B power-up and to control BIASP and BIASN initialization during power-up. When signal RPD is high (and signal RPD__is low), gain stages 12A and 12B are disabled.

Referring to FIGS. 3A and 3B, temperature compensation signalling is accomplished through the temperature-detecting stages 13A and 13B illustrated therein. The bias level outputs BIASP and BIASN of FIGS. 2A and 2B are the inputs to the temperature-detecting stages 13A and 13B of FIGS. 3A and 3B. The temperature-detecting stages 13A and 13B act to convert the reference currents $I_{BIASP}$ and $I_{BIASN}$ to the final compensated bias voltage at terminals MIRN and MIRP. The temperature-detecting stages 13A and 13B compensate for the increase in initial reference currents $I_{REFP}$ and $I_{REFN}$ with increasing supply voltage $V_{CC}$ and with decreasing temperature. Temperature-detecting stages 13A and 13B include transistors M31–M41 and M42–M52, respectively. These stages 13A and 13B generate, by mirror, reference bias currents $I_{REFP2}$ and $I_{REFN2}$ that compensate for supply voltage $V_{CC}$ and temperature variations through a series of long-channel, N-channel transistors M34–M37 having a channel length-to-width ratio of 4.5 to 4 and a series of long-channel, P-channel transistors M42–M45 having a channel length-to-width ratio of 9 to 3, each operating in the linear region. The gates of N-channel transistors M34–M37 are all connected to supply voltage $V_{CC}$ during operation, at which time signal SEL5V is high. The gates of P-channel transistors M42–M45 are all connected to reference voltage $V_{SS}$ during operation, at which time signal SEL5V is low. The proper length-to-width ratios vary over a very wide range, depending to some extent on the processing parameters used to form the transistors. The effective lengths (4.5 to 16 or 36 to 3) are determined by the number of transistors M34–M37 or M42–M45 in series, and that may be varied by use of programmed fuses that short out the series transistor or transistors nearest reference voltage $V_{SS}$.

An initial reference current $I_{REFP}$ is supplied by the reference circuit 11 of FIG. 1. That initial reference current $I_{REFP}$ is mirrored to the circuit of the first gain stage 12A of FIG. 2, comprising transistors M13–M21. A current $I_{BIASP}$ is imposed through transistors M13–M17. This current $I_{BIASP}$ is then mirrored to the first temperature-detecting stage 13A of FIG. 3, comprising transistors M31–M41. An increase in temperature causes an increase in the "TURN-ON" resistance of the long-channel transistors M34–M37. This, in turn, causes the gate-to-source voltage $V_{GS}$ plus the voltage drop [$V_{GS}$(M33)+V(M34–M37)] across transistors M34–M37 to increase also. Therefore, as the temperature increases, the bias voltage at terminal MIRN increases to generate higher current in the pre-driver stage described below in reference to FIG. 5. A conventional current reference decreases the reference current at high temperature, which reduces the speed of operation. The temperature-detecting stage 13A reduces the variations due to supply voltage $V_{CC}$. As supply voltage $V_{CC}$ increases, the initial reference current $I_{REFP}$ also increases to maintain the open-loop gain at unity. Therefore, as the supply voltage $V_{CC}$ increases, the initial reference current $I_{REFP}$ supplied to the temperature-detecting circuit 13A also increases and the "TURN-ON" resistance of the saturated long-channel transistors M34–M37 decreases. Total elimination of supply-voltage $V_{CC}$ variation is not desirable because the CMOS output switching time is referenced as a percentage of the supply voltage $V_{CC}$.

The explanation for the circuit of FIG. 3B is analogous to the explanation of the circuit of FIG. 3A, and is not repeated here.

During operation at very low supply voltage $V_{CC}$, it is sometimes desirable to bypass the temperature-detection stages 13A and 13B of FIGS. 3A and 3B, configuring the circuitry to produce the best speed possible. Signals SEL5V and its inverse SEL5V__are used for this purpose. If signal SEL5V is low, power through temperature-detecting stages 13A and 13B is reduced and the outputs at terminals MIRN and MIRP are set at $V_{CC}$ and $V_{SS}$, respectively.

Figure 4:
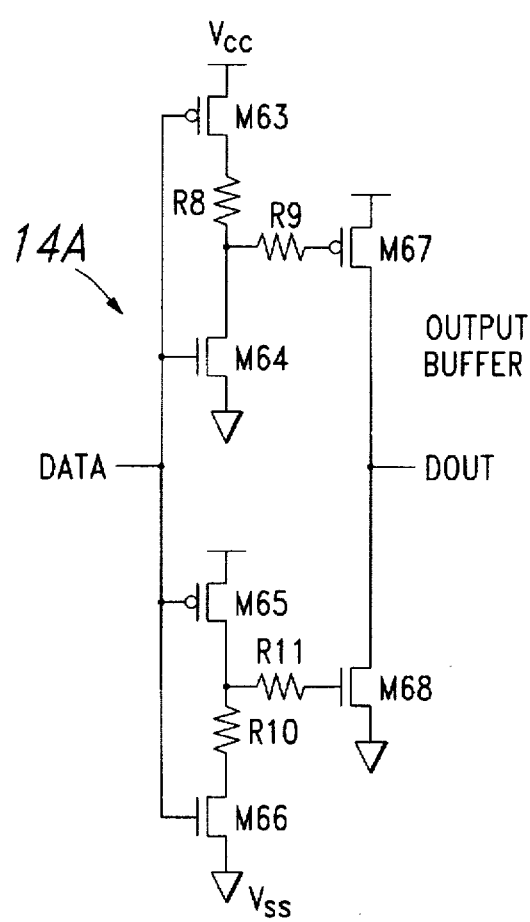
FIG. 4 is an example of prior-art output buffer.

An example of a prior-art output buffer 14A is illustrated in FIG. 4. In FIG. 4, transistors M63–M64 and resistors R8–R9 define the P-channel pre-driver stage. Transistors M65–M66 and resistors R10–R11 define the N-channel pre-driver stage. Output switching characteristics are defined through proper sizing of transistors and resistors. However, due to the wide range of temperature and power supply voltage in which the circuit 14A must operate, output characteristics may be optimized for one operating condition but not another. At low temperature and high supply voltage $V_{CC}$, when speed is not a problem but noise is, the current in the pre-driver stages of the output buffer 14A is limited and output switching is slowed, thus reducing noise. At high temperature and low supply voltage $V_{CC}$, speed is slowest and noise is minimal. Therefore, the bias voltages at terminals MIRN and MIRP allow a maximum pre-driver current, such that the overall output buffer speed is maximized.

Figure 5:
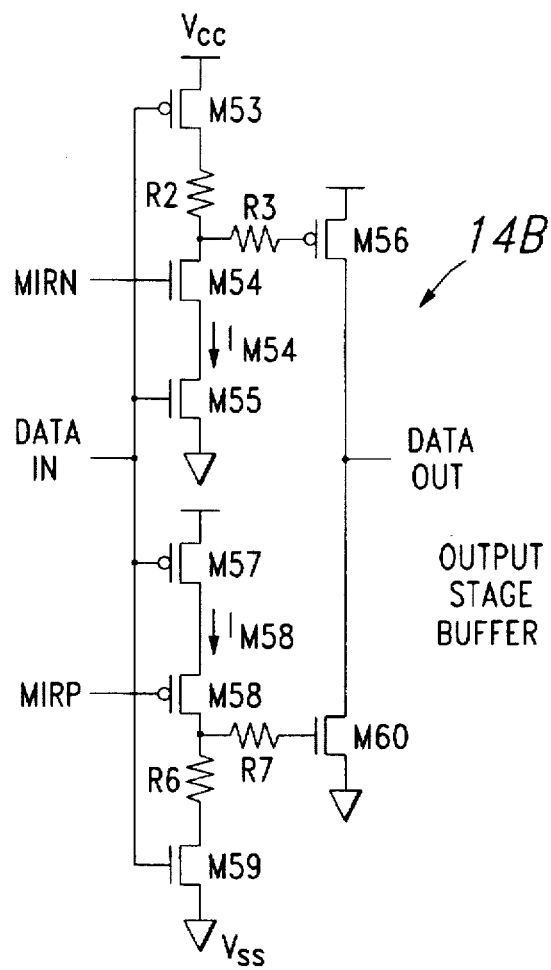
FIG. 5 is a schematic diagram of an example application of this invention to an output buffer stage.

In an example application of the circuitry of this invention, the output nodes MIRN and MIRP of the temperature-detecting circuits 13A and 13B are coupled to an output buffer 14B as described in FIG. 5. Driving off-chip loads requires special control of driver stage to minimize noise of power supplies due to switching currents and turn-on/turn-off rates of drivers, and to maximize the speed. The driver stage comprises transistors M56 and M60. In FIG. 5, transistors M53–M55 and resistors R2–R3 define the P-channel pre-driver stage and transistors M57–M59 and resistors R6–R7 define the N-channel pre-driver stage. Transistors M54 and M58 act to limit the rate at which the P-channel driver transistor M56 and the N-channel driver transistor M60, respectively, turn ON. With the addition of transistors M54 and M58 to pre-driver stages of the prior art, variation in output drive due to temperature and power supply variations is minimized, and output buffer 14B is optimized for all operating conditions.

Figure 6:
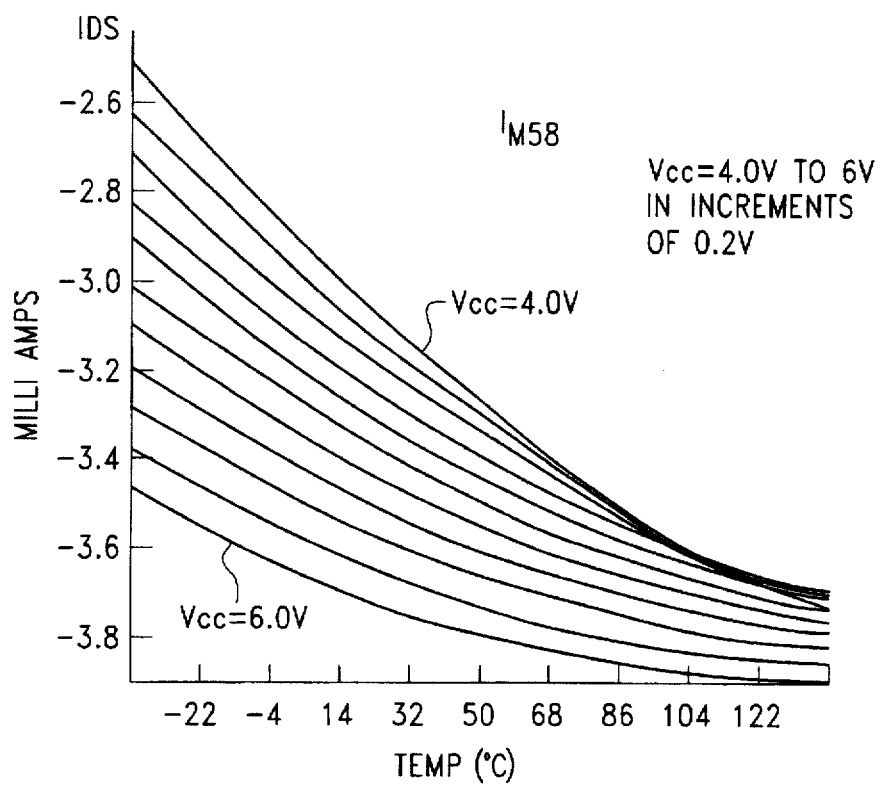
FIG. 6 is a graph of compensated drain-to-source current $I_{DS}$ vs. Temperature vs. Supply Voltage for transistor M58 of the output buffer circuit of FIG. 5.
Figure 7:
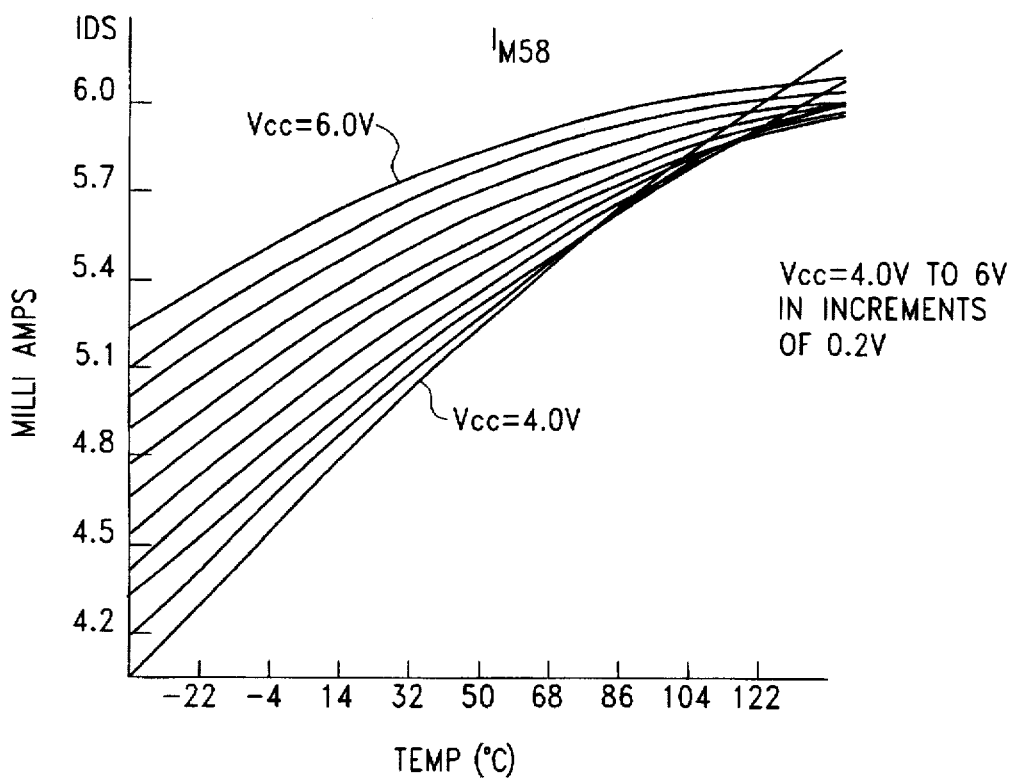
FIG. 7 is a graph of compensated drain-to-source current $I_{DS}$ vs. Temperature vs. Supply Voltage for transistor M54 of the output buffer circuit of FIG. 5.

Referring now to FIGS. 6 and 7, graphs illustrate how the compensated current $I_{M58}$ and $I_{M54}$, respectively, increase with increasing temperature and illustrate the rate at which the compensated currents change with change in supply voltage $V_{CC}$.

In summary, the supply-voltage-detecting circuit 11 described in FIG. 1 provides a constant reference current for subsequent gain stages 12A and 12B and for temperature-detecting stages 13A and 13B. Reference currents from supply-voltage-detecting circuit 11 are mirrored to gain stages 12A and 12B for amplification before being mirrored to temperature-detecting stages 13A and 13B. Temperature-detecting stages 13A and 13B generate bias voltages at terminals MIRN and MIRP, the bias voltages compensated for power supply and temperature variations. These bias voltages are then used to optimize preferred circuits for speed, noise, or power improvement. In an example output buffer circuit 14B, depending on the temperature and/or supply voltage $V_{CC}$ of the circuit, the switching rate of the output buffer 14B is allowed to 1) swing at full potential for faster speed or 2) is limited as the signals at the MIRN and MIRP terminals affect the turn-on of the output buffer 14B. At low temperature and high supply voltage $V_{CC}$, when speed is not a problem but noise is, the current in the pre-driver stages of the output buffer stage 14B is limited and output switching is slowed, thus reducing noise. At high temperature and low supply voltage $V_{CC}$, speed is slowest and noise is minimal. Therefore, the bias levels of the voltages at terminals MIRN and MIRP allow a maximum pre-driver current, such that the overall output buffer 14B speed is maximized.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A temperature and supply-voltage sensing circuit, comprising:

a supply-voltage-detecting circuit having a supply voltage input, the supply-voltage detecting circuit supplying first and second reference currents that vary with change in the supply voltage; and first and second temperature-detecting circuits coupled to said first and second reference currents, respectively, said first and second temperature-detecting circuits generating first and second bias voltages that vary with change in temperature and with change in said first and second reference currents;

wherein said first and second temperature-detecting circuits each includes long-channel transistor, each said long-channel transistor having a resistance sensitive to temperature change, each said long-channel transistor connected to change said first and second bias voltages in response to change in temperature.

2. The sensing circuit of claim 1, further comprising first and second gain stages coupling said first and second reference currents, respectively, to said first and second temperature-detecting circuits, respectively.

3. The sensing circuit of claim 1, wherein one said long-channel transistor is four N-channel transistors, the source-drain paths of said four N-channel transistors connected in series and wherein each of the gates of said four N-channel transistors is connected to said supply voltage during operation.

4. The sensing circuit of claim 1, wherein one said long-channel transistor is four P-channel transistors, the source-drain paths of said four P-channel transistors connected in series and wherein each of the gates of said four P-channel transistors is connected to ground during operation.

5. The sensing circuit of claim 1, wherein one said long-channel transistor comprises four N-channel transistors connected in series, each said N-channel transistor having a length-to-width ratio of 4.5 to 4.

6. The sensing circuit of claim 1, wherein one said long-channel transistor comprises four P-channel transistors connected in series, each said P-channel transistor having a length-to-width ratio of 9 to 3.

7. The sensing circuit of claim 1, wherein said first and second bias voltages control a P-channel pre-driver stage and a N-channel pre-driver stage of an output buffer, respectively.

8. A temperature and supply-voltage sensing circuit for an integrated circuit, said sensing circuit comprising:

a supply-voltage detecting stage connected to a supply voltage, said supply-voltage detecting stage supplying an initial reference current that varies with change in said supply voltage; a subcircuit for receiving said initial reference current and for providing a second reference current proportional to said initial reference current; and a temperature-detecting stage, said temperature-detecting stage coupled to receive said second reference current, said temperature-detecting stage converting said second reference current to a temperature and supply-voltage compensated bias voltage;

wherein said temperature-detecting stage includes a long-channel transistor, said long-channel transistor having a resistance sensitive to temperature change, said long-channel transistor connected to vary said compensated bias voltage in response to change in temperature.

9. The sensing circuit of claim 8, wherein said subcircuit is a gain stage.

10. The sensing circuit of claim 8, wherein said long-channel transistor is a N-channel transistor having a gate connected to said supply voltage.

11. The sensing circuit of claim 8, wherein said long-channel transistor is a P-channel transistor having a gate connected to ground.

12. The sensing circuit of claim 8, wherein said long-channel transistor is four N-channel transistors, each said N-channel transistor having a length-to-width ratio of 4.5 to 4.

13. The sensing circuit of claim 8, wherein said long-channel transistor is four P-channel transistors, each said P-channel transistor having a length-to-width ratio of 9 to 3.

14. The sensing circuit of claim 8, wherein said bias voltage controls a pre-driver stage of an output buffer.

15. A sensing circuit for an integrated circuit, said sensing circuit comprising:

a supply-voltage detecting stage having a supply-voltage input, said supply-voltage detecting stage supplying first and second initial reference currents, said initial reference currents varying with change in said supply voltage; a subcircuit for receiving said first and second initial reference currents and for providing first and second current proportional to said first and second initial reference currents, respectively, and first and second temperature-detecting stages receiving said proportional first and second currents and converting said proportional first and second currents to first and second bias voltages, respectively, said first and second bias voltages supplied at first and second outputs of said first and second temperature-detecting stages, respectively;

wherein each said first and second temperature-detecting stage includes at least one long-channel transistor, each said long-channel transistor having a resistance sensitive to temperature change, each said long-channel transistor connected to vary said first and second bias voltages in response to change in temperature.

16. The sensing circuit of claim 15, wherein one said long-channel transistor comprises four N-channel transistors are with source-drain paths connected in series, and wherein each of the gates of said four N-channel transistors is connected to said supply voltage.

17. The sensing circuit of claim 15, wherein one said long-channel transistor comprises four P-channel transistors with source-drain paths connected in series, and wherein each of the gates of said four P-channel transistors is connected to ground.

18. The sensing circuit of claim 15, wherein said subcircuit comprises first and second gain stages which provide the proportional first and second currents, respectively.

19. The sensing circuit of claim 15 wherein one said long-channel transistor is four N-channel transistors connected in series, each said N-channel transistor having a length-to-width ratio of 4.5 to 4.

20. The sensing circuit of claim 15, wherein one said long-channel transistor is four P-channel transistors connected in series, each said P-channel transistor having a length-to-width ratio of 9 to 3.

21. The sensing circuit of claim 15, wherein said first and second bias voltages control a P-channel pre-driver stage and a N-channel pre-driver stage of an output buffer, respectively.

* * * * *